(12) United States Patent
Tagami et al.

(10) Patent No.: US 7,372,124 B2
(45) Date of Patent: May 13, 2008

(54) LIGHT-RECEIVING ELEMENT AND PHOTODETECTOR USING THE SAME

(75) Inventors: Takashi Tagami, Osaka (JP); Kenichi Nakama, Osaka (JP)

(73) Assignee: Nippon Sheet Glass Company, Limited, Tokyo (JP)

(*) Notice: Subject to any disclaimer, the term of this patent is extended or adjusted under 35 U.S.C. 154(b) by 0 days.

(21) Appl. No.: 10/959,960

(22) Filed: Oct. 6, 2004

(65) Prior Publication Data

US 2005/0058454 A1 Mar. 17, 2005

Related U.S. Application Data

(62) Division of application No. 10/088,275, filed on Mar. 14, 2002, now abandoned.

(51) Int. Cl.
*H01L 31/00* (2006.01)
(52) U.S. Cl. .................................... 257/458
(58) Field of Classification Search ........ 359/613–640; 398/41–42, 47, 48, 52–53; 257/458
See application file for complete search history.

(56) References Cited

U.S. PATENT DOCUMENTS

| | | | | |
|---|---|---|---|---|
| 4,916,305 A | * | 4/1990 | Antell | ........... 257/184 |
| 4,996,163 A | * | 2/1991 | Sasaki | ........... 438/59 |
| 5,144,397 A | * | 9/1992 | Tokuda et al. | ........... 257/656 |
| 5,179,423 A | | 1/1993 | Kravetz et al. | |
| 5,214,527 A | * | 5/1993 | Chang et al. | ........... 398/202 |
| 5,528,071 A | * | 6/1996 | Russell et al. | ........... 257/458 |
| 5,680,411 A | * | 10/1997 | Ramdane et al. | ........... 372/50.1 |
| 6,016,212 A | * | 1/2000 | Durant et al. | ........... 398/131 |
| 6,239,891 B1 | | 5/2001 | Nakama | |
| 6,334,014 B1 | | 12/2001 | Nitta et al. | |

FOREIGN PATENT DOCUMENTS

| | | |
|---|---|---|
| EP | 762170 | 3/1997 |
| JP | 54-113384 A | 9/1979 |
| JP | 61-120906 A | 6/1986 |
| JP | 63-73121 A | 4/1988 |
| JP | 63-153407 A | 6/1988 |
| JP | 3-146833 A | 6/1991 |

* cited by examiner

*Primary Examiner*—Ori Nadav
(74) *Attorney, Agent, or Firm*—RatnerPrestia

(57) ABSTRACT

A light-receiving element may easily detect the barycenter of a light intensity of light having a long-wavelength band in an optical communication. An InGaAs layer (i-type layer) and a p-type InP layer are stacked on an n-type InP substrate. Electrodes are formed on both sides of the top surface of the p-type layer, and an electrode is formed on the bottom surface of the n-type substrate. An incident light impinged upon the light-receiving element is photoelectricly-converged into a photocurrent, and the photocurrent flows in the p-type layer to the electrodes. As a result, a current is derived from each of the electrodes, the magnitude thereof being dependent on the distances from the light impinging position to respective electrodes. The barycenter of a light intensity may be calculated from the currents derived from the electrodes and a light intensity may be obtained from the summation of the currents.

3 Claims, 6 Drawing Sheets

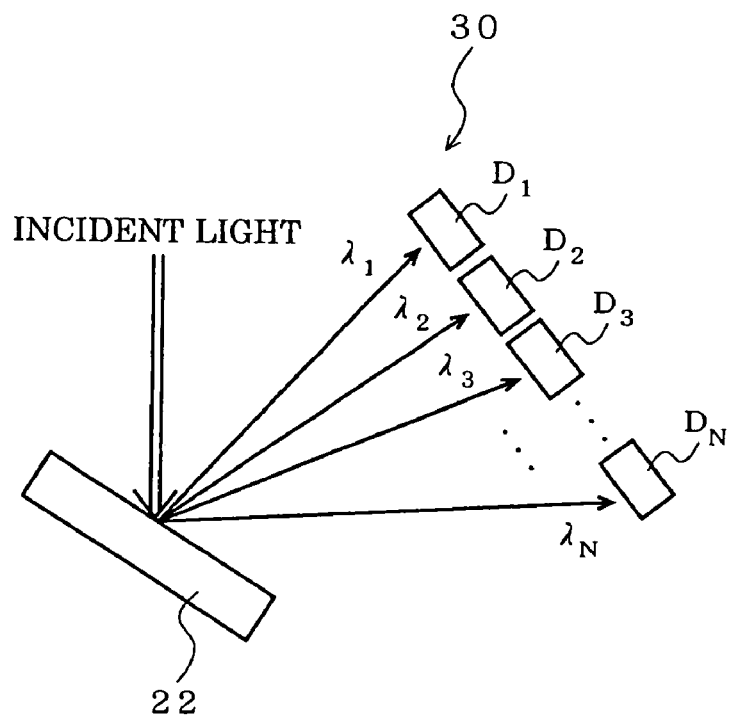
F I G. 4
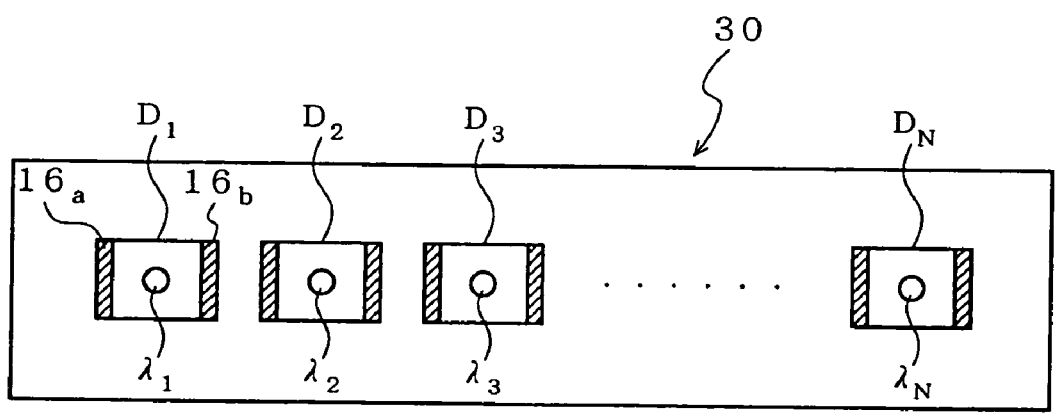
F I G. 5

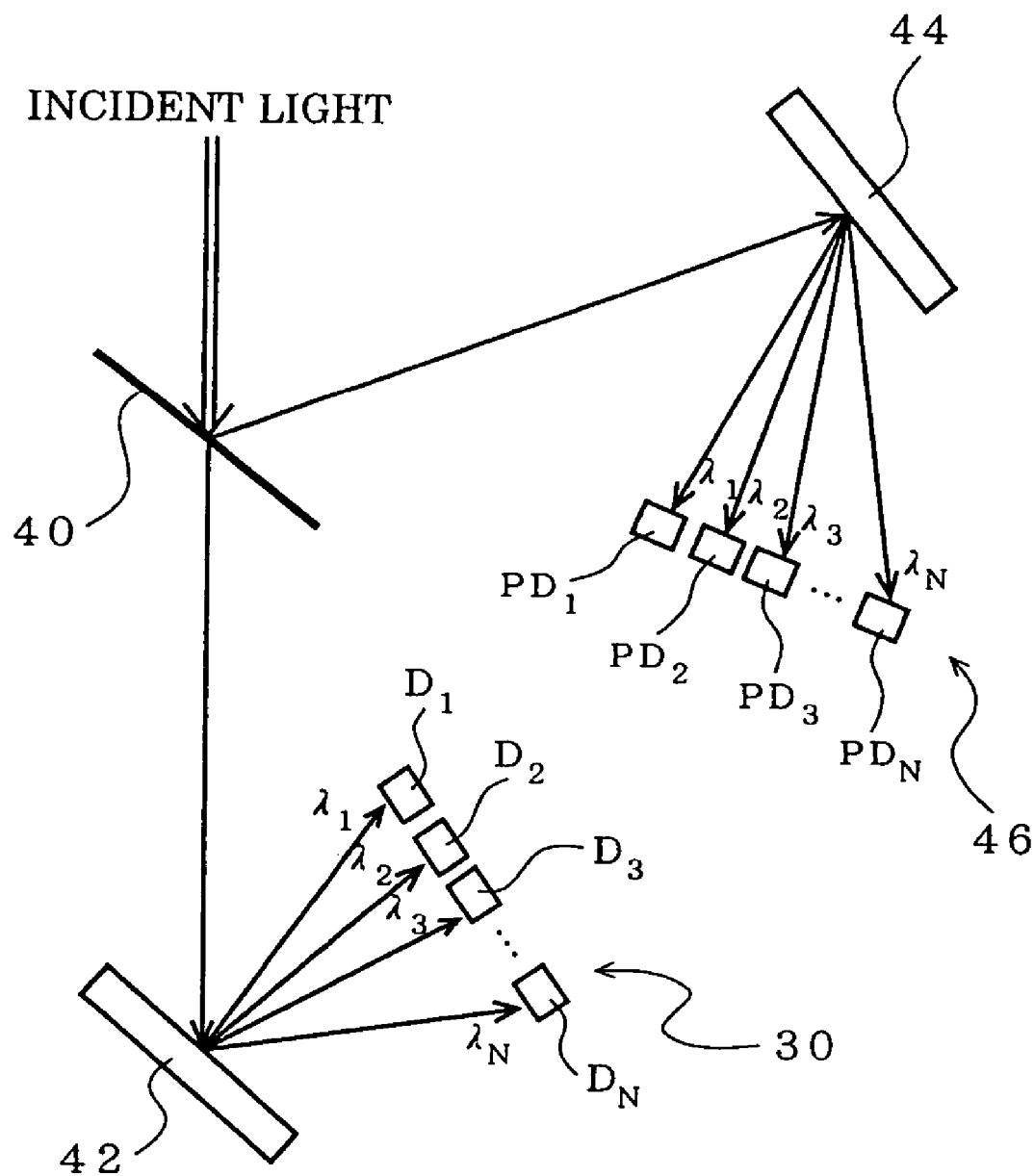
F I G . 6

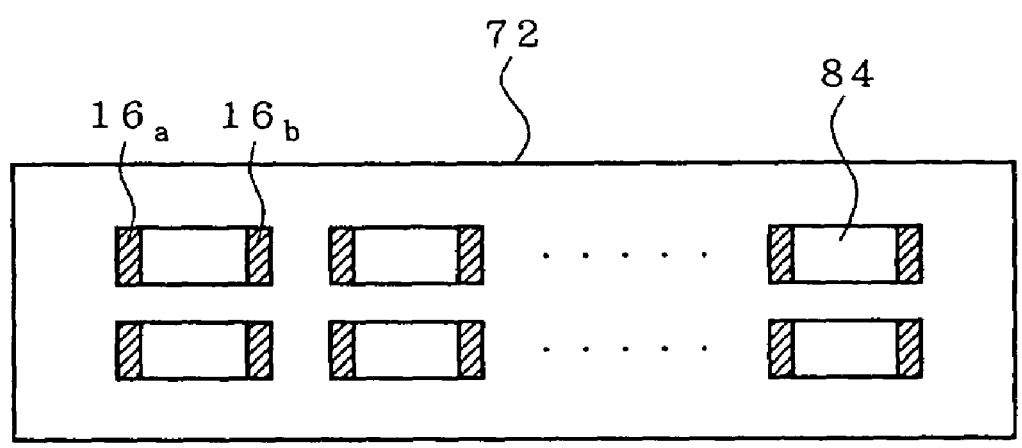
F I G. 9

LIGHT-RECEIVING ELEMENT AND
PHOTODETECTOR USING THE SAME

This application is a divisional of U.S. patent application Ser. No. 10/088,275, filed Mar. 14, 2002 now abandoned.

TECHNICAL FIELD

The present invention relates to a light-receiving element for continuously detecting a light intensity and a barycenter thereof for the spectrum of a long-wavelength band (e.g., 1.3-1.55,μm band) used in an optical communication 10 field, a photodetector employing such a light-receiving element, and an optical demultiplexer using such a photodetector.

BACKGROUND ART

An optical demultiplexer (for example, Light Detecting System PSS-100 commercially available by Shimazu Seisakusho) has been known in which the light collected by a collective lens is reflected by a mirror, the reflected light is demultiplexed by a diffraction grating, and the demultiplexed 20 lights are detected by a photodetector. The photodetector employed in this''' optical demultiplexer is a light-receiving element array and is used as a spectrum monitor for wavelength.

In this conventional photodetector, the barycenter of a 25 light intensity is monitored by dividing the spectrum of one wavelength by means of an array of light-receiving elements (e.g., five elements). Therefore, the resolution of the photodetector is determined by an array pitch of the light-receiving elements. In this manner, the conventional 30 photodetector may merely obtain the resolution corresponding to the array pitch of the light-receiving elements, so that it is difficult for the conventional photodetector to further increase its resolution. It should be noted that the barycenter of a light intensity means herein the barycenter of spectrum distribution of a wavelength.

In order to resolve the problems described above, the inventors of this application have thought that a semiconductor position sensor for detecting the position of a light spot is used as a light-receiving element array of the photodetector in the optical demultiplexer. Because the semiconductor position sensor is a non-divided type of element different from the light-receiving element array described above, the semiconductor position sensor may detect continuously and spatially the barycenter of a light intensity.

As a conventional semiconductor position sensor, the sensor has been known in which a p-type resistor layer is provided on the top surface of a high-resistance Si substrate (i-type layer), on the bottom surface thereof a n-type layer is provided, and two electrodes are provided oppositely on the p-type resistor layer.

Because surface layers form a p-n junction in this semiconductor position sensor, a photocurrent is generated due to a photoelectric effect when an incident light impinges upon the p-type resistor layer. The photocurrent generated at the position upon which an incident light impinges is divided into two currents, respective magnitude thereof being in reverse proportion to respective resistances from the light impinging position to respective two electrodes, so that the light impinging position may be detected by monitoring each current derived from respective two electrodes.

The conventional semiconductor position sensor uses a Si substrate as described above, and then has a poor sensitivity in a long-wavelength band for an optical communication.

Therefore, in a case that the conventional semiconductor position sensor is used for a light-receiving element array of an optical demultiplexer, it is difficult to detect the barycenter of a light intensity of light having a long-wavelength band.

DISCLOSURE OF THE INVENTION

An object of the present invention is to provide a light-receiving element used in a photodetector of an optical demultiplexer, which may detect the barycenter of a light intensity of light including a long-wavelength band.

Another object of the present invention is to provide a photodetector of an optical demultiplexer, which uses such a light-receiving element.

A further object of the present invention is to provide an optical demultiplexer having an increased resolution using such a photodetector.

According to the present invention, a semiconductor position sensor using III-V group compound semiconductor having a good sensitivity in a long-wavelength band (e.g., 1.55 μm band) for an optical communication is used as a light-receiving element in order to monitor the spectrum of the long-wavelength band.

A first aspect of the present invention is a light-receiving element for detecting a light intensity and a barycenter thereof for an incident light of a long-wavelength, the light-receiving element comprising a semiconductor layer of III-V group compound semiconductor; a first conductivity-type of resistor layer provided on the top surface of the semiconductor layer; a second conductivity-type, opposite to the first conductivity-type, of substrate provided on the bottom surface of the semiconductor layer; and at least one pair of opposing electrodes provided on the resistor layer.

A second aspect of the present invention is a photodetector for detecting a light intensity and a barycenter thereof for each of lights demultiplexed from an incident light, the incident light including a plurality of wavelengths, the photodetector comprising one or more light-receiving elements described above.

A third aspect of the present invention is an optical demultiplexer for demultiplexing an incident light including multiplexed wavelengths, the optical demultiplexer comprising an optical means for demultiplexing the incident light into a plurality of lights; and a photodetector for receiving the plurality of light demultiplexed by the optical means. An array of light-receiving elements described above may be used for the photodetector.

BRIEF DESCRIPTION OF THE DRAWINGS

FIG. 4 is a diagram of a photodetector for detecting a light intensity and the barycenter thereof for each of demultiplexed lights.

FIG. 5 is a plan-view of the photodetector shown in FIG. 4.

FIG. 6 is a diagram of another photodetector for detecting a light intensity and the barycenter thereof for each of demultiplexed lights.

FIG. 9 shows an example in which two lines of light-receiving elements each line having the same number of elements are integrated in one semiconductor chip.

BEST MODE FOR CARRYING OUT THE INVENTION

FIRST EMBODIMENT

Figure 1A:
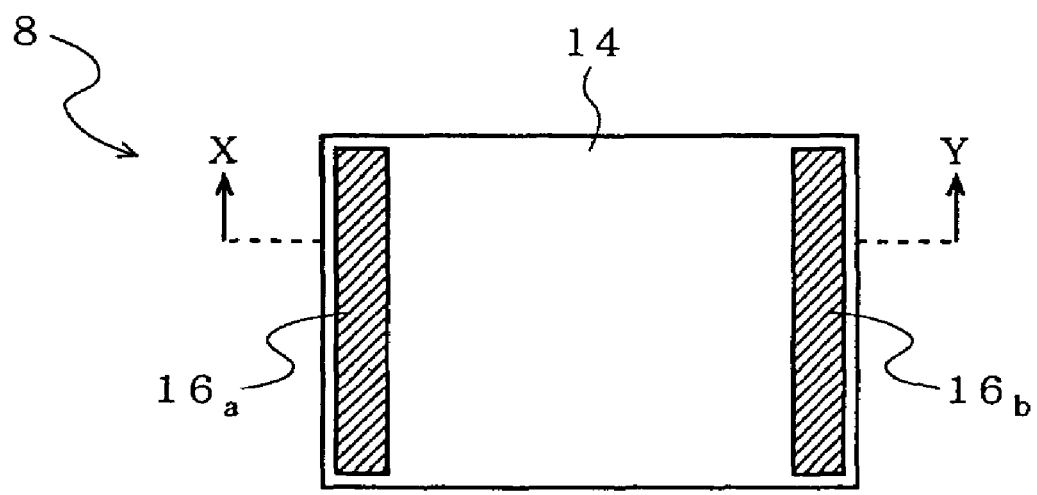
FIG. 1A is a plan view of a light-receiving element in accordance with the present invention.
Figure 1B:
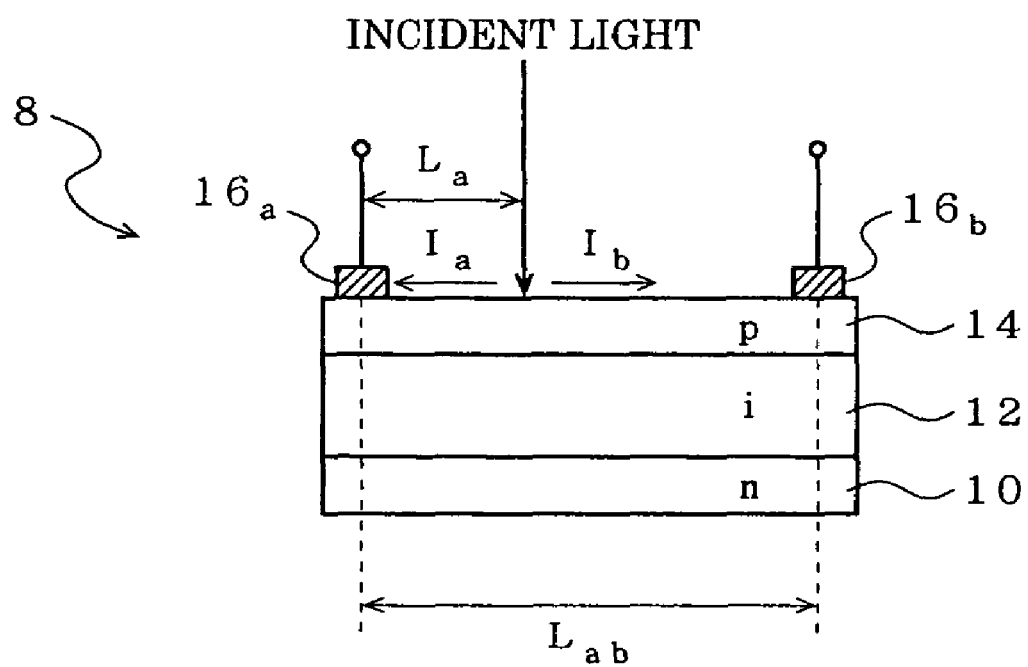
FIG. 1B is a cross-sectional view taken along the X-Y line in FIG. 1A.

Referring to FIGS. 1A and 1B, there is shown a light-receiving element in accordance with the present invention, i.e. a light-receiving element 8 for monitoring one wavelength. FIG. 1A is a plan view, and FIG. 1B is a cross-sectional view taken along the X-Y line in FIG. 1A. In the light-receiving element 8, an InGaAs layer (i-type layer) 12 and a p-type InP layer 14 are stacked on an n-type InP substrate 10. Electrodes 16a and 16b are formed on both sides of the top surface of the p-type layer 14, and an electrode (not shown) is formed on the bottom surface of the n-type substrate 10.

The basic operation of the light-receiving elements 8 will now described. An incident light impinged upon the light-receiving element is photoelectric-converged into a photocurrent which flows in the p-type layer 14 toward the electrodes 16a and 16b. As a result, a current is derived from each of the electrodes 16a and 16b, the magnitude thereof being dependent on the distances from the light impinging position to respective electrodes 16a and 16b. That is, the photocurrent I is divided into two currents in reverse proportion to respective resistances from the light impinging position to respective electrodes 16a and 16b. It is assumed herein that the distance between the electrodes 16a and 16b is $L_{ab}$, and the distance between the light impinging position and the electrode 16a is $L_a$.

If the sheet resistance of the p-type layer 14 is uniform, then the currents $I_a$ and $I_b$ derived from the electrodes 16a and 16b are represented by the following formulas.

$$I_a = I \times (L_{ab} - L_a)/L_{ab} \quad (1)$$

$$I_b = I \times L_a/L_{ab} \quad (2)$$

The ratio of $I_a$ to $I_b$ and the ratio of the subtraction $(I_a - I_b)$ to the summation $(I_a + I_b)$ are calculated as follows.

$$I_a/I_b = L_{ab}/L_a - 1 \quad (3)$$

$$(I_a - I_b)/(I_a + I_b) = 1 - (2L_a/L_{ab}) \quad (4)$$

It is appreciated that respective ratios of $I_a/I_b$ and $(I_a - I_b)/(I_a + I_b)$ are the values irrelevant to a light intensity and a variation thereof. Therefore, if respective ratios of $I_a/I_b$ and $(I_a - I_b)/(I_a + I_b)$ in the formulas (3) and (4) are measured, then the distance $L_a$ may be obtained. As a result, the light impinging position may be precisely detected irrelevantly to the variation of a light intensity.

In the light-receiving element of the present embodiment, the material of InGaAs system having a high photo sensitivity for a long-wavelength is used, so that a high performance detection of the light impinging position may be possible for a long-wavelength for which the material of Si system has a poor sensitivity. As the material of InGaAs system, III-V group compound semiconductor such as GaAs, AlGaAs, InAs, InGaAsP, and the like may be used. Also, Ge may be used in an infrared wavelength. The summation of the currents $I_a$ and $I_b$ is equal to the photocurrent I, so that the intensity of an incident light may be monitored from the photocurrent I.

Figure 2:
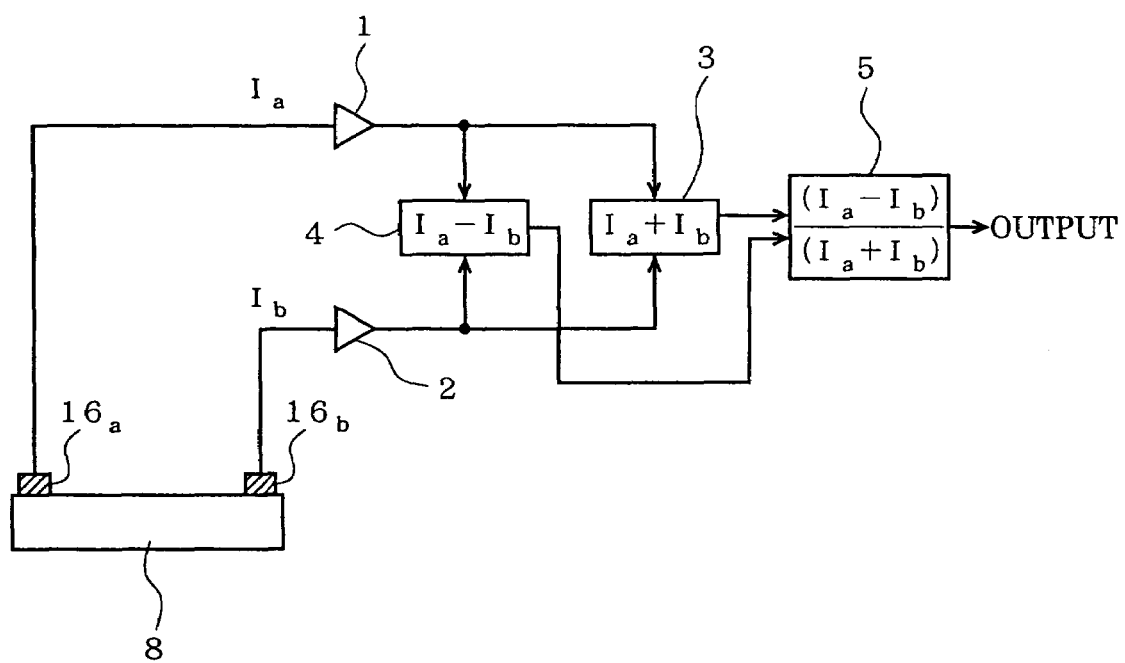
FIG. 2 is a diagram of a circuit for measuring the position upon which an incident light impinges using a current from an light-receiving element.

Referring to FIG. 2, there is shown a circuit for measuring the position upon which an incident light impinges using the current $I_a$ and $I_b$ derived from the electrodes 16a and 16b of the light-receiving element 8. The currents $I_a$ and $I_b$ are amplified by preamplifiers 1 and 2, respectively, and the amplified currents are summed in an adder 3 to obtain $(I_a + I_b)$ as well as are substrated in a substracter 5 to obtain $(I_a - I_b)$ Then, the division $(I_a - I_b)/(I_a + I_b)$ is calculated in a divider 5 to measure the light impinging position based on the formula (4).

While the circuit shown in FIG. 2 employs a method for detecting the light impinging position based on the formula (4), the light impinging position may be measured by calculating the division $I_a/I_b$ based on the formula (3).

SECOND EMBODIMENT

A time-division type of photodetector in accordance with the present invention will now be described, the photodetector detecting a light intensity and a barycenter thereof for each of N lights which are demultiplexed from an incident light including multiplexed N time-divisioned wavelength by a diffraction grating.

Figure 3:
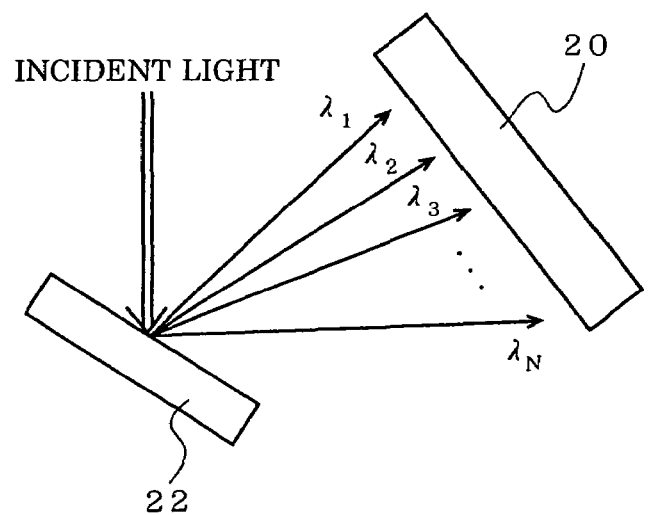
FIG. 3 is a diagram of a time-division type of photodetector.

FIG. 3 shows a photodetector 20 for monitoring the demultiplexed N lights of wavelengths $\lambda_1, \lambda_2, \ldots, \lambda_N$. While the structure of the photodetector 20 is basically the same as that of the light-receiving element 8 shown in FIG. 1, the light-receiving area of the photodetector is formed so large as to receive all the demultiplexed lights. In FIG. 3, the incident light including N time-divisioned wavelength is demultiplexed into N lights by a diffraction grating 22. The demultiplexed lights including wavelengths $\lambda_1, \lambda_2, \ldots, \lambda_N$, respectively, impinge upon the photodetector 20.

When each of the demultiplexed lights impinges upon the photodetector 20, the photodetector may operate in a time-divisional manner to detect the barycenter of a light intensity for each of N demultiplexed lights. Also, each light intensity of N demultiplexed lights may be detected from respective photocurrents as illustrated with reference to FIG. 1.

THIRD EMBODIMENT

A photodetector in accordance with the present invention will now be described, the photodetector detecting a light intensity and a barycenter thereof for each of N lights which are demultiplexed from an incident light including multiplexed N wavelength by a diffraction grating.

FIG. 4 shows a photodetector 30 for monitoring the demultiplexed N lights of wavelengths $\lambda_1, \lambda_2, \ldots, \lambda_N$. The photodetector 30 is structured by N light-receiving elements $D_1, D_2, \ldots, D_N$ arrayed in one dimension. Each light-receiving element is a light-receiving element as illustrated with reference to FIG. 1. FIG. 5 shows a plan-view of the photodetector 30. Respective light-receiving elements are arrayed so that the electrodes 16a and 16b of respective element are lined up in an arraying direction of the elements.

In the present embodiment, the incident light including N wavelengths is demultiplexed into N lights by a diffraction grating 22, and the demultiplexed N lights impinge upon N light-receiving elements, respectively. As a result, the barycenter of a light intensity of each of N demultiplexed lights may be detected. Also, each intensity of N demultiplexed lights may be detected from a photocurrent of each light-receiving element as illustrated with reference to FIG. 1.

FORTH EMBODIMENT

Another example of a photodetector in accordance with the present invention will now be described, the photodetector detecting a light intensity and a barycenter thereof for each of N demultiplexed lights which are demultiplexed from an incident light including multiplexed N wavelength by a diffraction grating.

FIG. 6 is a diagram for illustrating this photodetector. In this photodetector, an incident light is split into two lights by a half mirror 40. One split light is demultiplexed into N lights by a diffraction grating 42, and each barycenter of the light intensities thereof is detected by a first photodetector 30 shown in FIG. 5. The other split light is demultiplexed into N lights by a dittraction grating 44, and respective light intensities of N demodulated lights are detected by a second photodetector 46 consisting of N photodiodes $PD_1$, $PD_2$, . . . , $P_{DN}$ each positioned at the focal point of demultiplexed light.

In this embodiment, the second photodetector 46 may be fabricated so that the light-receiving area thereof is smaller than that of the first photodiode 30, resulting in the reduction of noise therein. As a result, the second photodetector 46 is suitable for detecting the light intensity of a weak incident light.

FIFTH EMBODIMENT

Figure 7:
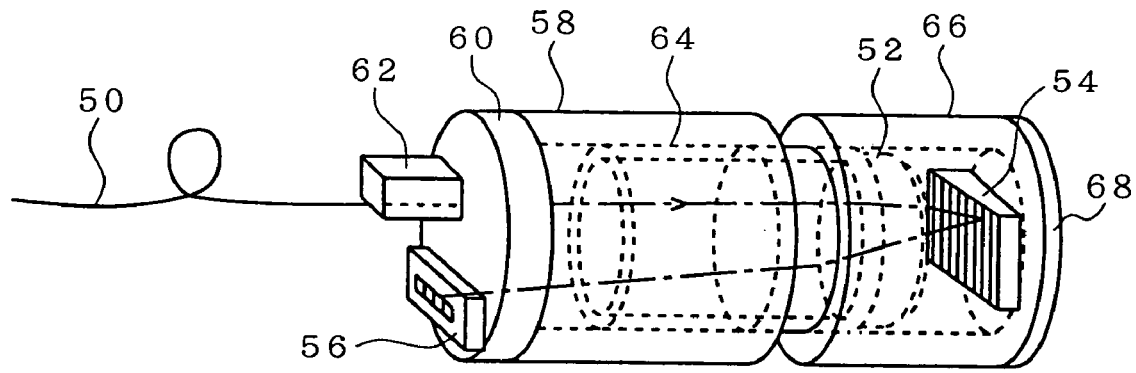
FIG. 7 is a diagram of an optical demultiplexer in accordance with the present invention.

An optical demultiplexer in accordance with the present invention will now be described, the optical demultiplexer using the photodetector in the second or third embodiment. FIG. 7 shows an optical demultiplexer in an optical communication system based on a wavelength multiplexed transmission, which may be used for demultiplexing a wavelength multiplexed incident light into a plurality of lights each having a different wavelength, and for detecting each light intensity and barycenter thereof for respective demultiplexed lights. The optical demultiplexer comprises components such as one input optical fiber 50, a collimator lens 52, a diffraction grating 54, and an optical detector 56, which are accommodated in three tubular members fitted to each other. The input optical fiber 50 is fixedly coupled to a window 60 for fixing the fiber by means of a fiber coupling member 62, the window 60 being an end face of a transparent tube 58 for accommodating the fiber. The collimator lens 52 is fixed to an end of an intermediate tube 64. The diffraction grating 54 is fixed to a window 68, the window 68 being an end face of a tube 66 for accommodating the diffraction grating. In this optical demultiplexer, the tubes 58 and 66 are fitted to both ends of the intermediate tube 64 so as to be movable in the direction of light axis and rotatable around the light axis for active alignment.

According to this optical demultiplexer, the light from the input optical fiber 50 impinges upon the diffraction grating 54 via the collimator lens 52. The light is demultiplexed by the diffraction grating 54, and the demultiplexed lights pass through the collimator lens 52 to be detected by the photodetector 56.

The photodetector 56 may detect each light intensity and a barycenter thereof for respective demultiplexed lights, as explained in the embodiments 2 and 3.

As in the photodetector illustrated in the embodiment 4, the structure may be employed in which a wavelength multiplexed light is split into two lights to detect the barycenter of a light intensity by the first photodetector 30 and a light intensity by the second photodetector 46.

Sixth Embodiment

Figure 8:
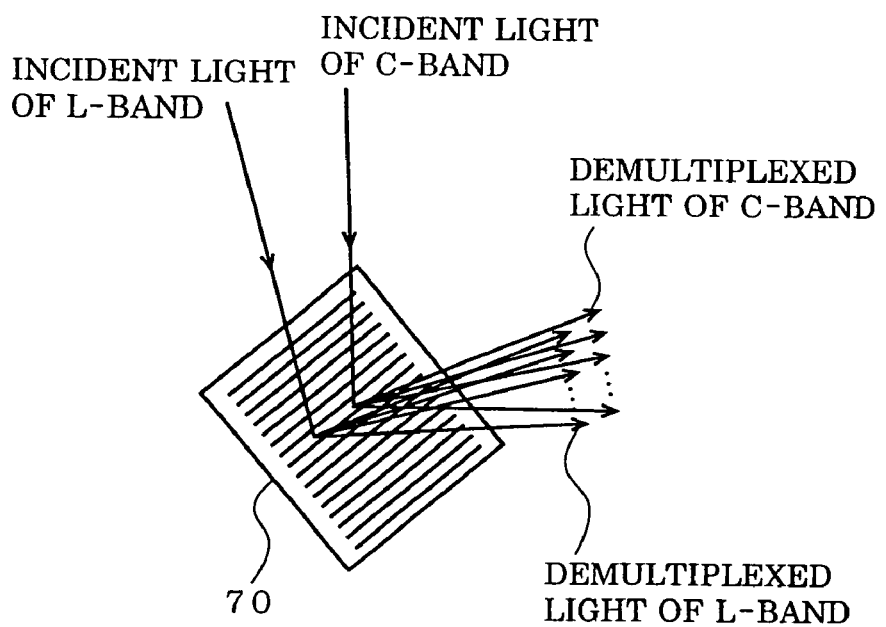
FIG. 8 is a diagram illustrating the structure for detecting each barycenter of $k_1$ wavelengths of C-band and $k_2$ wavelengths of L-band.

FIG. 8 shows the case that, in an optical communication system, an incident light includes $k_1$ wavelengths ($k_1$ is an integer equal to or larger than 1) of C-band and $k_2$ wavelengths ($k_2$ is an integer equal to or larger than 1) of L-band, the $k_1$ and $k_2$ wavelengths being multiplexed. The incident light is demultiplexed into $k_1$ lights of C-band and $k_2$ lights of L-band by a diffraction grating 70, respectively. Respective barycenters of the light intensities of ($k_1+k_2$) demultiplexed lights may be detected by a first photodetector (not shown) consisting of $k_1$ light-receiving elements for C-band and a second photodetector (not shown) consisting of $k_2$ light-receiving elements for L-band.

When the first photodetector for C-band and the second photodetector for L-band are formed on separate semiconductor chips, respectively, it is difficult that the relative position and the parallelism between semiconductor chips are implemented with high accuracy. Therefore, it is preferable that the first and second photodetectors are integrated in one chip. If the incident angles of lights of C and L-bands to the diffraction grating 70 are preferably selected, then the demultiplexed lights of C and L-bands may be collected on two adjacent lines. The first and second photodetectors are arrayed in two lines on the positions upon which the demultiplexed lights impinge. Herein, the incident light of C-band impinges upon the diffraction grating at a smaller angle to the normal of the diffraction grating in comparison with the incident light of L-band.

The arrangement of light-receiving element in one semiconductor chip is not limited to a line of $k_1$ elements of C-band and a line of $k_2$ elements of L-band, but two lines of elements each line having the same number of elements may be arranged. For example, two lines of elements each line having $k_1$ element (i.e., $k_1$ elements×2 lines) in the case of $k_1 \geq k_2$ may be provided in one semiconductor chip, or two lines of elements each line having $k_2$ element (i.e., $k_2$ elements×2 lines) in the case of $k_1 \leq k_2$ may be provided in one semiconductor chip. FIG. 9 shows an example in which two lines of light-receiving elements 8 each line having the same number of elements are integrated in one semiconductor chip 72.

The incident light including two bands, i.e. C-band and L-band, has been explained hereinbefore. Generally, for the incident light including k bands, k lines of light-receiving elements may be arranged in two dimensions to detect the demultiplexed lights.

The photodetector having described-above structure may be used for the light demultiplexer shown in FIG. 7.

The invention claimed is:

1. An optical demultiplexer for demultiplexing an incident light including multiplexed wavelengths, comprising:

an optical means for demultiplexing the incident light into a plurality of lights, the incident light including N (N is an integer equal to or larger than 2) time-divisioned wavelengths; and a photodetector for receiving the plurality of lights demultiplexed by the optical means, and detecting a light intensity and a barycenter thereof for each of lights demultiplexed from the incident light, the photodetector including N light-receiving elements arrayed in one dimension, wherein each light-receiving element includes:

a semiconductor layer of III-V group compound semiconductor, a first conductivity-type of resistor layer provided on a top surface of the semiconductor layer, a second conductivity-type, opposite to the first conductivity-type of substrate provided beneath a bottom surface of the semiconductor layer, the resistor layer and the substrate each being III-V semiconductor layers, and first and second electrodes provided on the resistor layer separated by a region of the resistor layer, wherein light incident on the region from one of the corresponding plurality of lights generates a first signal to the first electrode and a second signal to the second electrode, the first and second signals indicating a position of the light incident on the resistor layer within the region relative to the first and second electrodes, the incident light being incident on the resistor layer without first passing through any conductive layer.

2. An optical demultiplexer for demultiplexing an incident light including multiplexed wavelengths, comprising:

an optical means for splitting the incident light into two lights;

a first optical means for demultiplexing one of the two lights;

a second optical means for demultiplexing the other of the two lights;

a photodetector for receiving the lights demultiplexed by the first optical means for detecting a barycenter of a light intensity for each of the demultiplexed lights; and a light-receiving element array for receiving the lights demultiplexed by the second optical means for detecting a light-intensity for each of the demultiplexed lights, wherein the photodetector includes N light-receiving elements arrayed in one dimension, wherein each light-receiving element includes:

a semiconductor layer of III-V group compound semiconductor, a first conductivity-type of resistor layer provided on a top surface of the semiconductor layer, a second conductivity-type, opposite to the first conductivity-type of substrate provided beneath a bottom surace of the semiconductor layer, and first and second electrodes provided on the resistor layer separated by a region of the resistor layer, wherein light incident on the region from one of the corresponding plurality of lights generates a first signal to the first electrode and a second signal to the second electrode, the first and second signals indicating a position of the light incident on the resistor layer within the region relative to the first and second electrodes.

3. The optical demultiplexer of claim 2, wherein the light-receiving element array is a photodiode array.

* * * * *